Sept. 23, 1958 T. A. DOWDS 2,853,656

PRINTED CIRCUIT PANEL ASSEMBLY

Filed Aug. 7, 1953

INVENTOR
THOMAS A. DOWDS
BY
Ralzemond B. Parker
ATTORNEY

United States Patent Office 2,853,656

Patented Sept. 23, 1958

2,853,656

PRINTED CIRCUIT PANEL ASSEMBLY

Thomas A. Dowds, Philadelphia, Pa., assignor to Burroughs Corporation, Detroit, Mich., a corporation of Michigan Application August 7, 1953, Serial No. 373,004

9 Claims. (Cl. 317—101)

This invention relates to electrical component assemblies and more particularly to plug-in electrical component assemblies associated with printed circuits.

The present day needs of complex industrial electronic circuitry and particularly involved electronic computer circuitry, demand quickly detachable plug-in units for changes in programming the operation. Space limitations also dictate miniaturization in many cases. As a result of these requirements printed circuit panels have been developed which materially reduce the space requirements and result in the breakdown of the circuitry into individually assembled units. These circuit panels are generally stacked in a parallel relationship, which presents the problem of interconnection.

In many instances, the programming changes require only simple changes in circuitry involving the insertion or cutting out of a few electrical components like a rectifier, for example. It would be desirable to provide a clip-in unit for electrical components of this character which when clipped in will not require special positioning means or sockets and soldering to hold them in their respective positions, but are so positioned by internal means. Upon discovering such a desirable clip-in unit the further problem arises of changing the circuitry associated with the electrical components and that may be more of a problem than interchanging the components. Since the circuitry may be readily changed by employing printed circuit panels which inherently are adaptable to the clip-in component units the programming changes are effected. Accordingly, a plug-in assembly is desired that is readily detachable including a pair of individual circuit panels interconnected by means of the clip-in electrical component units.

It is, therefore, a general object of the invention to provide an improved plug-in electrical assembly.

It is another object of the invention to provide improved interconnection means for use with associated printed circuitry panels.

It is still another object of the invention to provide removable electrical circuit components having an internal spring for making forced electrical contact without soldering while acting as a connecting means between the components and external printed circuit panels.

It is still a further object of the invention to provide a sandwich type electrical circuit assembly including spaced printed circuit panels having internal conductive spring interconnecting means.

These objects are accomplished by providing a sandwich type of electrical assembly comprising a pair of wiring panels interconnected by intermediate resilient biasing elements in forced contact with the wiring panels. Printed circuit type of panels may be used wherein conductive interconnections between the panels are made by means of a helical conductive spring in forced contact with conductive members on the printed circuitry of respective panels. Compact electrical components themselves are mounted between panels and are held in forced electrical contact by internal resilient means. These components are housed in one or more cases of insulating material forming separate installable and removable units of the panel assembly. Each unit has external contacts on its opposite faces and is provided internally with resilient structure which urges the contacts into engagement with the printed circuitry on the panels with the desired light pressure. The resulting panel assembly has improved plug means provided which enables it to be readily interchanged by plugging into a mating electrical circuit.

Other objects and features of advantage of the present invention will be found throughout the following more detailed description of the invention particularly when considered in connection with the accompanying drawings, in which.

Figure 1:
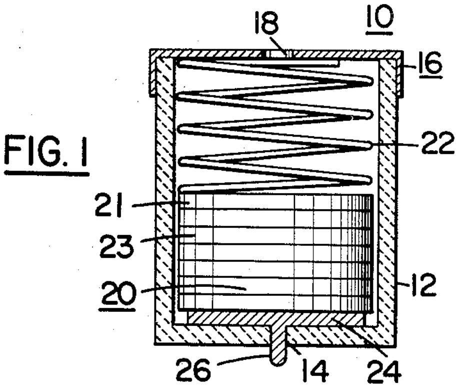
Fig. 1 is a longitudinal sectional view of an electrical rectifier component unit of one embodiment of the invention.

Referring now in particular to Fig. 1, the embodiment of the electrical component unit 10 is shown in this instance having a cylindrical or cup-shaped housing 12 of electrically insulating material with an open top end section. At the generally closed bottom end section of the housing there is provided a small aperture 14 adapted to receive one of the contact terminals 26 hereinafter to be described. A conductive cap 16 which has an aperture 18 centrally disposed therein is secured over the open end section of the housing 12. The cap 16 provides the other one of the electrical contact terminals for the unit. Within the housing there is located an electrical component 20 such as the stack of dry rectifier discs 21, 23, et cetera. The particular component shown in this instance is of the well known type of circular disc selenium rectifier element, but it should be understood that the component may alternatively be an ordinary resistor, carbon pile resistor, condenser or any other desired circuit element. A coiled compression spring 22 is confined between the stacked rectifier elements 20 and the cap 16. The spring 22 should have sufficient stiffness so that when it is compressed it will provide a relatively good electrical contact between each of the rectifier elements. The spring also acts as an electrical connecting means between the rectifier elements and the conductive cap 16. Below the stacked rectifier elements 20 there is confined a contact plate 24 provided with the protruding contact terminal button 26. The button 26 fits into the closely mating aperture 14 which provides a sliding clearance for same, the button acting as the opposed terminal of the electrical component unit 10. The spring 22 additionally acts to provide restricted resilient motion of the contact button 26.

Figure 4:
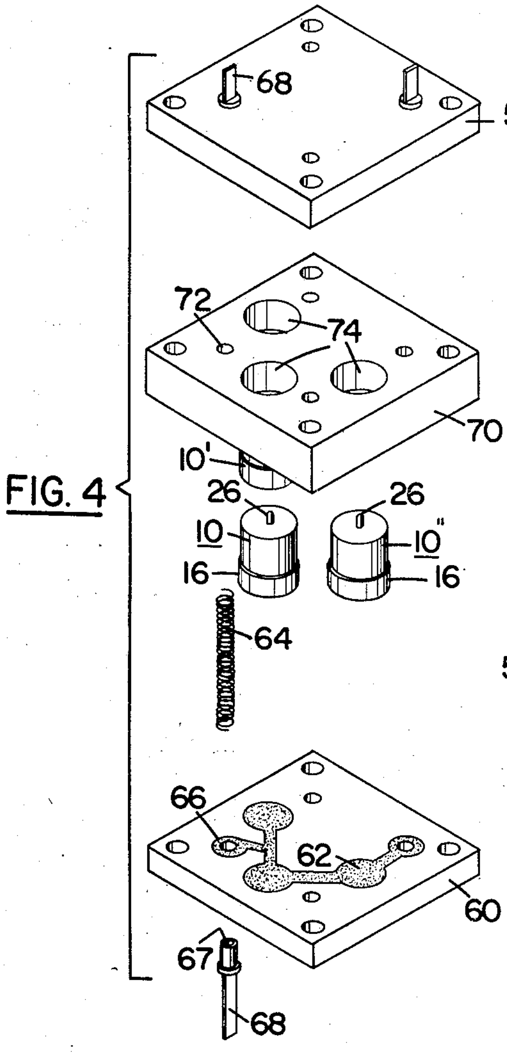
Fig. 4 is an exploded perspective view of a sandwich type assembly embodying the invention.

The electrical connection between the unit 10 and the external circuitry may be made by clipping or positioning the unit between a pair of wired panels having conductive members adapted to mate with the contact terminals 16 and 26 as illustrated in Fig. 4 and will be explained hereinafter. When the electrical component unit 10 is so positioned, the protruding portion of the button 26 is partially forced within the aperture 14 so as to transmit a force through the rectifier elements 20 to further compress the spring 22 and thereby effect the forced electrical contact between the unit 10 and the conducting members located on the compressive panels. A plurality of electrical component units 10 may be cascaded between a pair of compressive panels by fitting the protruding button 26 of one unit into the closely mating aperture 18 located on the cap 16 of the succeeding unit. When cascaded in this manner, the aperture 18 must provide a tight fit sufficient for a good electrical contact. An alternative method of cascading results by providing a disc or electrical terminal between the button of one unit and the cap of the next. This provides a simplified method of arranging the components with external circuitry so as to result in a bridge rectifier circuit, for instance. In this manner, any number of units may be cascaded and further results in breaking down the electrical components into relatively smaller units. In some applications it may be found that the compressive panels may not be readily adapted for applying conductive members to mate with the cap 16 in which case it may be more desirable to provide an external connection to the cap by means of a soldered electrical lead adjacent to the aperture 18. In this instance, an aperture in the compressive panel is desirable to allow passage of the electrical lead therethrough.

Figure 2:
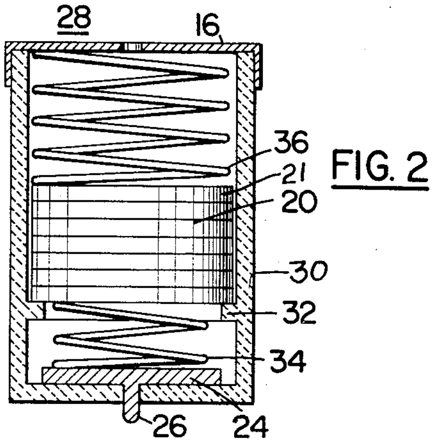
Fig. 2 is a longitudinal sectional view of another embodiment of a rectifier component unit constructed in accordance with the invention.

Now going to Fig. 2, a modification of the electrical component unit as indicated by the reference character 28 is illustrated employing a pair of compression springs 34 and 36. The structural arrangement of the assembly unit is substantially as shown in the unit 10 of Fig. 1. The insulative housing 30 is provided with a shoulder 32 formed intermediate its ends for supporting the rectifier elements 20 thereon. The rectifier elements 20 in this embodiment are electrically contacted by an auxiliary compressive spring 34 which, in turn, is further confined by the contact plate 24, and its associated button 26, resting on the bottom end section of the housing 30 in the manner hereinbefore discussed. The primary compressive spring 36 is confined between the topmost rectifier element 21 and the cap 16 for the same reasons described in connection with the embodiment of Fig. 1. The auxiliary spring 34 is of different compressive strength than the spring 36. This structure results from the desirability of providing a specified conductive contact pressure which may differ from the rectifier element contact pressure.

Figure 3:
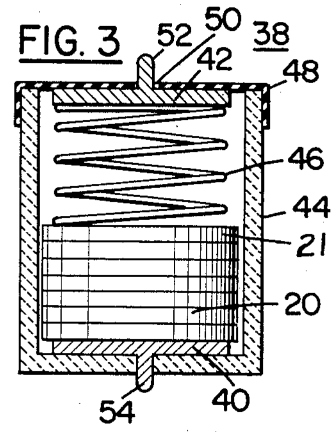
Fig. 3 is a longitudinal sectional view of a further embodiment of a rectifier component unit constructed in accordance with the invention.

Now referring to Fig. 3 a further modification of the electrical component unit generally indicated by the reference character 38, is illustrated having a pair of contact plates 40 and 42 at opposite ends of the cylindrical housing 44. The structure located below the compression spring 46, including the spring itself, is substantially as described in connection with Fig. 1. The spring 46 is restrained between the topmost disc 21 of the group of rectifier discs generally indicated by the reference numeral 20 and the contact plate 42. A cap 48 is made of an insulating material and is secured over the open end section of the housing 44. The cap 48 is provided with an aperture 50 centrally disposed thereon to receive the protruding conductive button 52. The resulting electrical component unit 38 in this instance may readily be clipped between a pair of restraining members having dimples disposed thereon to receive the buttons 52 and 54.

A further application of the resulting unit hereinabove described is their incorporation into a solenoid assembly so as to act as an arc suppressor. Since it is so readily clipped in, its use as an arc suppressor is readily adaptable to present solenoid manufacturing techniques. The unit when utilized for this application may be clipped in between a pair of conductive members associated with the solenoid, members having a dimple disposed thereon to position the unit as previously described.

Figure 5:
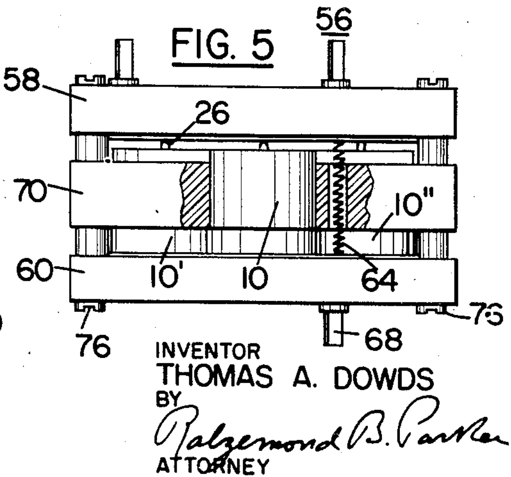
Fig. 5 is a side view, partly in section, of the assembly shown in Fig. 4.

Now referring to Figs. 4 and 5, a sandwich type electrical circuit plug-in assembly, as indicated generally by the reference character 56, is illustrated employing a plurality of electrical component units 10, 10' et cetera. Although the units 10, 10' et cetera are referred to, it is merely for purposes of explanation since it is readily seen that the modifications represented by the units 28 or 38 may also be used. The electrical component units are sandwiched between a pair of printed circuit panels 58 and 60. The printed circuit panels 58 and 60 as illustrated in Fig. 4 have their associated conductive members located on the bottom side and top side of the panels respectively, and therefore, the conductive members associated with panel 58 do not appear. The conductive members are formed to closely mate with the conductive contact caps 16 and the conductive buttons 26 as may be readily seen by the printed conductive member 62 on panel 60. The printed circuit panels may also be interconnected by means of electrical conductive elements such as the helical conductive spring 64 contacting its respective mating conductive member 66 as illustrated on the panel 60 and thereby allows the assembly to be electrically accessible from both panels. The spring 64 is seated in a conductive depression 67 formed in the end of the plug terminal 68 which, in turn, fits its individual aperture and is rolled into contact with the conductive portion 66 or may contact it by other well known methods. The plug contacts 68 are formed to have a solid plug-in portion extending beyond the shoulder in contact with the outer face of the panel board as illustrated in both Figs. 4 and 5, so as to facilitate an external circuit connection either by soldering thereto or preferably snapping it into a female receptacle.

The conductive spring 64 and the electrical component units 10 are held in their respective positions by means of an insulating panel 70 provided with closely mating apertures 72 and 74 et cetera to receive the intermediate spring biased elements. When completely assembled, the structure may be held together by securing means such as the screws 76 shown in Fig. 5 fitting into apertures provided in the circuit panels and the positioning structure. The complete assembly may be readily plugged in and out of position when associated with female receptacles adapted to receive the plug contacts 68.

It is, therefore, clear from the foregoing description that the present invention has advanced the state of the art by providing an electrical component unit which may be readily used in conjunction with printed circuit panels so as to result in a compact sandwich type electrical assembly whereby the assembly may be readily plugged in and out of its associated circuitry. Novel means is provided for clipping spring biased rectifier or other electrical component units between a pair of spaced printed circuit panels.

Having therefore described detailed embodiments of the invention, setting forth their organization and their mode of operation, those features believed descriptive of the nature of the invention are defined with particularity in the appended claims.

What is claimed is:

1. In combination, a pair of printed circuit panels being arranged in a spaced apart parallel relationship with printed circuit network thereof exposed on the adjacent faces of the panels, one or more substantially cylindrical electrical components having electrical terminals of sufficient compressive strength allowing pressure actuated electrical contact to be made thereto, the electrical components positioned between the spaced panels with their electrical terminals in forced electrical contact with the circuit networks thereof, an insulative positioning structure located between the printed circuit panels and having apertures closely mating with the outer cylindrical surfaces of the electrical components to receive same for holding the electrical components from lateral displacement, and at least one electrical conductive member passing through at least one printed circuit panel so as to be in electrical contact with a preselected portion of the circuit network on the inside face of the panel and extending to the opposite outer face of the panel.

2. A sandwich type printed circuit assembly including a pair of printed circuit panels arranged in spaced parallel relationship having printed circuit networks facing one another, at least one electrical component interposed between said panels, a substantially cylindrical housing for the electrical component to completely enclose same and having electrical terminals at the end sections, the housing further characterized by a dimension in the direction of the panels greater than the spacing therebetween, the positioning of the housing between the printed circuit panels acting to place the electrical components within said housing in forced contact with the printed network, and an electrical conductive member passing through at least one of the printed circuit panels for electrically connecting same to the printed circuit network, said electrical member providing an electrical terminal on the opposite face of said panel.

3. A printed circuit assembly comprising, in combination, a pair of printed circuit panels arranged in a fixed spaced apart parallel relationship with the printed circuit networks thereof exposed on the adjacent faces of the panels, an electrical component sub-assembly positioned between the printed circuit panels in forced mating electrical contact with the printed circuit networks on the panels, the electrical component comprising a cup-shaped insulative housing having an aperture in the closed end section of the same, a stack of rectifier elements fitting within the insulative housing with each element extending transversely of said housing, an electrical conductive element having a protruding contact extending from one side thereof, the conductive element being positioned within the housing in electrical contact with one end of the stack of rectifier elements with the protruding contact slidably projecting through the aperture in the closed end section of the housing, an electrical conductive cap member positioned over the open end section of the insulative housing and secured to the sides thereof, and a coiled compression spring confined between and in electrical contact with the cap member and the other end of the stack of rectifier elements, the compression spring maintaining the rectifier elements in close physical contact with one another and yieldingly maintaining said protruding contact in projecting relation from the closed end of the housing, and a structure surrounding the electrical component sub-assembly and positioned between the printed circuit panels for holding the electrical component from lateral displacement.

4. A printed circuit assembly comprising, in combination, an electrical component sub-assembly including a generally cylindrically shaped housing having at least one resistingly depressible electrical contact button in one end thereof, a stack of rectifier elements in the housing with each element extending transversely thereof, a coiled compression spring of electrically conductive material in the housing and seated so as to urge the rectifier elements in close physical contact with one another and to serve as an electrical connection between the same and the opposite ends of the housing, a printed circuit panel having a printed circuit network on one face thereof, the printed circuit panel positioned with the printed network facing the electrical component sub-assembly and engaging said contact button to form an electrical connection therewith, a second printed circuit panel having a printed circuit network on one face thereof, the second printed circuit panel being positioned with its printed network facing the electrical component sub-assembly and engaging the end of the housing opposite to the button to form an electrical connection therewith, and means positioned between the printed circuit panels and acting to hold said component sub-assembly from lateral displacement.

5. In combination, a pair of rigid panels of electrical insulating material each carrying printed wires on at least one surface thereof, means connecting the panels together in fixed spaced apart substantially parallel relationship with their printed wires exposed on adjacent faces of said panels, and one or more electrical components having electrical terminals of sufficient compressive strength allowing pressure actuated electrical contact to be made thereto, said electrical components being positioned between said spaced panels and having their electrical terminals in forced electrical contact with the printed wires on the adjacent faces of said panels.

6. In combination, a pair of printed circuit panels, means fixing said panels in spaced apart substantially parallel relationship with their printed circuit networks exposed on the opposing faces of said panels, one or more electrical components having electrical terminals of sufficient compressive strength allowing pressure actuated electrical contact to be made thereto, said electrical components being positioned between said spaced panels with their electrical terminals in forced electrical contact with said circuit networks, means positioned between said panels for holding said electrical components from lateral displacement, and at least one electrical conductive member carried by one of said panels and providing a terminal for at least one of said circuit networks for connection thereof to associated apparatus.

7. A sandwich type printed circuit assembly including a pair of printed circuit panels held in spaced substantially parallel relationship and having printed circuit networks facing one another, at least one electrical component sandwiched between said panels, a housing for said electrical component to completely enclose same and having electrical terminals oppositely disposed thereon, said housing being further characterized by having a dimension in the direction of the panels greater than the spacing therebetween, the sandwiching of said housing between said printed circuit panels acting to place electrical components within said housing in forced contact with said printed networks, and an electrically conductive terminal member carried by one of said printed circuit panels for electrically connecting its circuit network to associated apparatus.

8. A printed circuit assembly comprising in combination, a pair of printed circuit panels arranged in a fixed spaced apart, substantially parallel relationship with their printed circuit networks exposed on adjacent faces of said panels, an electrical component sub-assembly positioned between the printed circuit panels in forced mating electrical contact with said printed circuit networks, said electrical component comprising an insulated housing having an aperture in a closed end section of the same, a stack of rectifier elements fitted within the insulated housing with each element extending transversely of said housing, an electrical conductive element having a protruding contact extending from one side thereof, said conductive element being positioned within the housing in electrical contact with one end of a stack of rectifier elements with the protruding contact slidably projecting through the aperture in the closed end section of said housing, an electrically conductive cap member positioned over another end section of said housing and secured to the sides thereof, and spring means confined between and in electrical contact with the cap member and the other end of the stack of rectifier elements, said spring means maintaining the rectifier elements in close physical contact with one another and yieldingly maintaining said protruding contact in projecting relation with the closed end of said housing, and an insulated structure surrounding said electrical component sub-assembly and positioned between the printed circuit panels for holding the electrical component from lateral displacement relative to said panels.

9. A printed circuit assembly comprising, in combination, an electrical component sub-assembly including a housing having at least one resistingly depressible electrical contact button in one end thereof, a stack of rectifier elements in the housing with each element extending transversely thereof, spring means of electrically conducting material in said housing and seated so as to urge the rectifier elements in close physical contact with one another and to serve as an electrical connection between the same and the opposite end of the housing, a printed circuit panel having a printed circuit network on one face thereof, the printed circuit panel being positioned with the printed network facing the electrical component sub-assembly and engaging said contact button to form an electrical connection therewith, a second printed circuit panel having a printed circuit network on one face thereof, said second printed circuit panel being positioned with its printed network facing the electrical component sub-assembly and engaging the end of the housing opposite to the button to form an electrical connection therewith, and means positioned between the printed circuit panels and acting to hold said component sub-assembly from lateral displacement relative to said panels.

References Cited in the file of this patent

UNITED STATES PATENTS

| | | |
|---|---|---|
| 2,215,667 | Sherman | Sept. 24, 1940 |
| 2,314,104 | Richards | Mar. 16, 1943 |
| 2,459,788 | Bonner | Jan. 25, 1949 |
| 2,474,988 | Sargrove | July 5, 1949 |
| 2,611,010 | Sass | Sept. 16, 1952 |
| 2,651,745 | Marrow | Sept. 8, 1953 |